United States Patent
DeLaCruz et al.

(10) Patent No.: US 12,255,176 B2
(45) Date of Patent: Mar. 18, 2025

(54) SCALABLE ARCHITECTURE FOR REDUCED CYCLES ACROSS SOC

(71) Applicant: ADEIA SEMICONDUCTOR TECHNOLOGIES LLC, San Jose, CA (US)

(72) Inventors: Javier A. DeLaCruz, San Jose, CA (US); Richard E. Perego, Thornton, CO (US)

(73) Assignee: Adeia Semiconductor Technologies LLC, San Jose, CA (US)

( * ) Notice: Subject to any disclaimer, the term of this patent is extended or adjusted under 35 U.S.C. 154(b) by 0 days.

(21) Appl. No.: 18/347,510

(22) Filed: Jul. 5, 2023

(65) Prior Publication Data

US 2023/0369286 A1 Nov. 16, 2023

Related U.S. Application Data

(63) Continuation of application No. 16/677,213, filed on Nov. 7, 2019, now Pat. No. 11,862,602.

(51) Int. Cl.
*H01L 25/065* (2023.01)
*H01L 23/00* (2006.01)
*H01L 23/48* (2006.01)

(52) U.S. Cl.
CPC ........ *H01L 25/0652* (2013.01); *H01L 23/481* (2013.01); *H01L 24/33* (2013.01); *H01L 2224/32225* (2013.01)

(58) Field of Classification Search
CPC ... H01L 25/0652; H01L 23/481; H01L 24/33; H01L 2224/32225

(Continued)

(56) References Cited

U.S. PATENT DOCUMENTS 5,753,536 A 5/1998 Sugiyama et al.
5,771,555 A 6/1998 Eda et al.
(Continued)

FOREIGN PATENT DOCUMENTS

CN 101477512 * 7/2009
CN 104050141 * 9/2014
(Continued)

OTHER PUBLICATIONS

Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.
(Continued)

*Primary Examiner* — Sheng-Bai Zhu
(74) *Attorney, Agent, or Firm* — Knobbe, Martens, Olson & Bear, LLP

(57) ABSTRACT

A microelectronic assembly may include a semiconductor wafer having first and second surfaces extending in first and second directions, the semiconductor wafer having network nodes connected to one another via local adjacent connections each extending in only one of the first and second directions, and an interconnection structure comprising a low-loss dielectric material and having first and second opposite surfaces extending in third and fourth directions each oriented at an oblique angle relative to the first and second directions, the interconnection structure having local oblique connections each extending in only one of the third and fourth directions. The semiconductor wafer may be directly bonded to the interconnection structure such that each of the network nodes is connected with at least one of the other network nodes, without use of conductive bonding material, through at least one of the local adjacent connections and at least one of the local oblique connections.

10 Claims, 4 Drawing Sheets

(58) Field of Classification Search
USPC .................................................. 257/786
See application file for complete search history.

(56) References Cited

U.S. PATENT DOCUMENTS

| | | | |
|---|---|---|---|
| 6,080,640 A | 6/2000 | Gardner et al. | |
| 6,423,640 B1 | 7/2002 | Lee et al. | |
| 6,465,892 B1 | 10/2002 | Suga | |
| 6,760,314 B1 | 7/2004 | Iwata | |
| 6,887,769 B2 | 5/2005 | Kellar et al. | |
| 6,908,027 B2 | 6/2005 | Tolchinsky et al. | |
| 6,910,198 B2 | 6/2005 | Teig et al. | |
| 7,045,453 B2 | 5/2006 | Canaperi et al. | |
| 7,105,980 B2 | 9/2006 | Abbott et al. | |
| 7,117,468 B1 | 10/2006 | Teig et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,809,123 B2 | 8/2014 | Liu et al. | |
| 8,841,002 B2 | 9/2014 | Tong | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,081 B1 | 1/2017 | Lai et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,899,442 B2 | 2/2018 | Katkar | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,707,087 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,573 B2 | 10/2021 | Uzoh et al. | |
| 11,158,606 B2 | 10/2021 | Gao et al. | |
| 11,169,326 B2 | 11/2021 | Huang et al. | |
| 11,171,117 B2 | 11/2021 | Gao et al. | |
| 11,176,450 B2 | 11/2021 | Teig et al. | |
| 11,195,748 B2 | 12/2021 | Uzoh et al. | |
| 11,205,625 B2 | 12/2021 | DeLaCruz et al. | |
| 11,244,920 B2 | 2/2022 | Uzoh | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,296,044 B2 | 4/2022 | Gao et al. | |
| 11,296,053 B2 | 4/2022 | Uzoh et al. | |
| 11,329,034 B2 | 5/2022 | Tao et al. | |
| 11,348,898 B2 | 5/2022 | DeLaCruz et al. | |
| 11,355,404 B2 | 6/2022 | Gao et al. | |
| 11,355,443 B2 | 6/2022 | Huang et al. | |
| 11,367,652 B2 | 6/2022 | Uzoh et al. | |
| 11,373,963 B2 | 6/2022 | DeLaCruz et al. | |
| 11,380,597 B2 | 7/2022 | Katkar et al. | |
| 11,385,278 B2 | 7/2022 | DeLaCruz et al. | |
| 11,387,202 B2 | 7/2022 | Haba et al. | |
| 11,387,214 B2 | 7/2022 | Wang et al. | |
| 11,393,779 B2 | 7/2022 | Gao et al. | |
| 11,462,419 B2 | 10/2022 | Haba | |
| 11,476,213 B2 | 10/2022 | Haba et al. | |
| 11,515,291 B2 | 11/2022 | DeLaCruz et al. | |
| 11,862,602 B2 | 1/2024 | DeLaCruz et al. | |
| 2003/0005399 A1* | 1/2003 | Igarashi | G06F 30/39 716/119 |
| 2003/0064553 A1 | 4/2003 | Oashi | |
| 2004/0084414 A1 | 5/2004 | Sakai et al. | |
| 2005/0044195 A1* | 2/2005 | Westfall | H04L 49/101 709/223 |
| 2006/0057945 A1 | 3/2006 | Hsu et al. | |
| 2006/0211153 A1 | 9/2006 | Farrar | |
| 2007/0111386 A1 | 5/2007 | Kim et al. | |
| 2010/0065846 A1* | 3/2010 | Satoh | G11C 29/40 257/E23.179 |
| 2014/0175655 A1 | 6/2014 | Chen et al. | |
| 2014/0189094 A1* | 7/2014 | Ditya | H04L 45/245 709/224 |
| 2015/0064498 A1 | 3/2015 | Tong | |
| 2015/0126042 A1 | 5/2015 | Pasquale et al. | |
| 2015/0171132 A1 | 6/2015 | Chen et al. | |
| 2015/0358393 A1 | 12/2015 | Pande | |
| 2016/0085706 A1 | 3/2016 | Deshpande et al. | |
| 2016/0343682 A1 | 11/2016 | Kawasaki | |
| 2018/0175012 A1 | 6/2018 | Wu et al. | |

(56) References Cited

U.S. PATENT DOCUMENTS

| | | |
|---|---|---|
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0219038 A1 | 8/2018 | Gambino et al. |
| 2018/0323177 A1 | 11/2018 | Yu et al. |
| 2018/0323227 A1 | 11/2018 | Zhang et al. |
| 2018/0331066 A1 | 11/2018 | Uzoh et al. |
| 2019/0115277 A1 | 4/2019 | Yu et al. |
| 2019/0131277 A1 | 5/2019 | Yang et al. |
| 2019/0221556 A1 | 7/2019 | Gomes et al. |
| 2019/0333550 A1 | 10/2019 | Fisch |
| 2019/0385935 A1 | 12/2019 | Gao et al. |
| 2020/0013765 A1 | 1/2020 | Fountain, Jr. et al. |
| 2020/0035641 A1 | 1/2020 | Fountain, Jr. et al. |
| 2020/0058622 A1* | 2/2020 | Chen ............... H01L 24/73 |
| 2020/0075534 A1* | 3/2020 | Gao ................. H01L 24/16 |
| 2020/0294908 A1 | 9/2020 | Haba et al. |
| 2020/0328162 A1 | 10/2020 | Haba et al. |
| 2020/0395321 A1 | 12/2020 | Katkar et al. |
| 2021/0098412 A1 | 4/2021 | Haba et al. |
| 2021/0118858 A1* | 4/2021 | Yu ..................... H01L 24/80 |
| 2021/0118864 A1 | 4/2021 | DeLaCruz et al. |
| 2021/0143125 A1 | 5/2021 | DeLaCruz et al. |
| 2021/0181510 A1 | 6/2021 | Katkar et al. |
| 2021/0193603 A1 | 6/2021 | DeLaCruz et al. |
| 2021/0193624 A1 | 6/2021 | DeLaCruz et al. |
| 2021/0193625 A1 | 6/2021 | Katkar et al. |
| 2021/0242152 A1 | 8/2021 | Fountain, Jr. et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0077063 A1 | 3/2022 | Haba |
| 2022/0077087 A1 | 3/2022 | Haba |
| 2022/0139867 A1 | 5/2022 | Uzoh |
| 2022/0139869 A1 | 5/2022 | Gao et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0343734 A1 | 10/2023 | Uzoh et al. |
| 2023/0360950 A1 | 11/2023 | Gao |
| 2023/0361074 A1 | 11/2023 | Uzoh et al. |
| 2023/0369136 A1 | 11/2023 | Uzoh et al. |
| 2023/0375613 A1 | 11/2023 | Haba et al. |
| 2024/0038702 A1 | 2/2024 | Uzoh |
| 2024/0055407 A1 | 2/2024 | Workman |
| 2024/0079376 A1 | 3/2024 | Suwito et al. |
| 2024/0105674 A1 | 3/2024 | Uzoh et al. |
| 2024/0170411 A1 | 5/2024 | Chang et al. |
| 2024/0186248 A1 | 6/2024 | Haba et al. |
| 2024/0186268 A1 | 6/2024 | Uzoh et al. |
| 2024/0186269 A1 | 6/2024 | Haba |
| 2024/0203917 A1 | 6/2024 | Katkar et al. |
| 2024/0213191 A1 | 6/2024 | Theil et al. |
| 2024/0213210 A1 | 6/2024 | Haba et al. |
| 2024/0217210 A1 | 7/2024 | Zhao et al. |
| 2024/0222239 A1 | 7/2024 | Gao et al. |
| 2024/0222315 A1 | 7/2024 | Uzoh |
| 2024/0222319 A1 | 7/2024 | Gao et al. |
| 2024/0266255 A1 | 8/2024 | Haba et al. |
| 2024/0298454 A1 | 9/2024 | Haba |
| 2024/0304593 A1 | 9/2024 | Uzoh |
| 2024/0312951 A1 | 9/2024 | Theil et al. |
| 2024/0332184 A1 | 10/2024 | Katkar et al. |
| 2024/0332227 A1 | 10/2024 | Uzoh et al. |
| 2024/0332231 A1 | 10/2024 | Uzoh |
| 2024/0332267 A1 | 10/2024 | Haba et al. |

FOREIGN PATENT DOCUMENTS

| | | |
|---|---|---|
| JP | 2013-033786 A | 2/2013 |
| JP | 2018-160519 | 10/2018 |
| WO | WO 2005/043584 A2 | 5/2005 |
| WO | WO 2014/209433 A1 | 12/2014 |

OTHER PUBLICATIONS

Moriceau, H. et al., "Overview of recent direct wafer bonding advances and applications," Advances in Natural Sciences—Nanoscience and Nanotechnology, 2010, 11 pages.

Nakanishi, H et al., "Studies on SiO2—SiO2 bonding with hydrofluoric acid. Room temperature and low stress bonding technique for MEMS," Sensors and Actuators, 2000, vol. 79, pp. 237-244.

Oberhammer, J et al., "Sealing of adhesive bonded devices on wafer level," Sensors and Actuators A, 2004, vol. 110, No. 1-3, pp. 407-412, see pp. 407-412, and Figures 1 (a)-1 (l), 6 pages.

Plobi, A. et al., "Wafer direct bonding: tailoring adhesion between brittle materials," Materials Science and Engineering Review Journal, 1999, R25, 88 pages.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820."

Morrison, Jim et al., "Samsung Galaxy S7 Edge Teardown," Tech Insights, includes description of hybrid bonded Sony IMX260 dual-pixel sensor, https://www.techinsights.com/blog/samsung-galaxy-s7-edge-teardown (posted Apr. 24, 2016; downloaded Jul. 11, 2023), 9 pages.

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted

(56) References Cited

OTHER PUBLICATIONS reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

* cited by examiner

SCALABLE ARCHITECTURE FOR REDUCED CYCLES ACROSS SOC

REFERENCE TO RELATED APPLICATIONS

The present application is a continuation of U.S. application Ser. No. 16/677,213, filed Nov. 7, 2019, the entire disclosure of which is incorporated by reference herein for all purposes.

BACKGROUND OF THE INVENTION

The present invention relates to microelectronic packaging and elements thereof and more specifically to an assembly for electrically interconnecting a plurality of processing cores in a common wafer.

The performance of larger processors or high performance computing systems has a diminishing return as the number of processing cores increases. CPU cores and SRAM may compete for limited area on a monolithic die, conventional network grid topologies have a larger number of hops and a higher latency as the number of cores increases, and the resistive-capacitive delay of metal wiring may increase as the number of cores increases, requiring frequent re-timing.

Conventional design architectures limit connections between processor core nodes to orthogonal horizontal and vertical paths, known as Manhattan routes. A hierarchical mesh network topology may improve latency within a network, but such topology is still subject to Manhattan route limitations and increasingly longer routes as the number of cores increases, so such systems are generally limited to connections between neighboring nodes than propagating connections across several nodes. Therefore, despite the advances that have been made in multi-core network grid topologies, there is still a need for further improvements.

BRIEF SUMMARY OF THE INVENTION

One aspect of the disclosure provides a microelectronic assembly that may include a semiconductor wafer having first and second opposite surfaces extending in first and second horizontal orthogonal directions, the semiconductor wafer having a grid of network nodes electrically connected to one another via local adjacent connections each extending in only one of the first and second horizontal orthogonal directions, and an interconnection structure comprising a low-loss dielectric material and having first and second opposite surfaces extending in third and fourth horizontal oblique directions that are each oriented at an oblique angle relative to the first and second directions, the interconnection structure having electrical connections including local oblique connections each extending in only one of the third and fourth horizontal oblique directions. The semiconductor wafer may be directly bonded to the interconnection structure such that each of the network nodes is electrically connected with at least one of the other network nodes. According to some examples, the electrical connection may be formed using direct dielectric bonding, non-adhesive techniques, such as a ZiBond® direct bonding technique, or a DBI® hybrid bonding technique, thermocompression bonding, or other techniques.

Another aspect of the disclosure provides a method including forming local adjacent connections on a surface of a semiconductor wafer, the surface extending in first and second horizontal orthogonal directions, the local adjacent connections electrically connecting a grid of network nodes to one another, the local adjacent connections each extending in only one of the first and second horizontal orthogonal directions. The method may also include forming local oblique connections on a surface of an interconnection structure comprising a low-loss dielectric material, the surface extending in third and fourth horizontal oblique directions that are each oriented at an oblique angle relative to the first and second directions, the local oblique connections each extending in only one of the third and fourth horizontal oblique directions. The method may further include directly bonding the semiconductor wafer to the interconnection structure such that each of the network nodes is electrically connected with at least one of the other network nodes, for example, using a direct bonding technique.

DETAILED DESCRIPTION

As used in this disclosure with reference to an element having a planar surface, a statement that an electrically conductive element is "at" a surface of a substrate indicates that, when the substrate is not assembled with any other element, the electrically conductive element is available for contact with a theoretical point moving in a direction perpendicular to the surface of the substrate toward the surface of the substrate from outside the substrate. Thus, a terminal or other conductive element which is at a surface of a substrate may project from such surface; may be flush with such surface; or may be recessed relative to such surface in a hole or depression in the substrate. In some embodiments, the conductive element may be attached to the surface or may be disposed in one or more layers of dielectric coating on the said surface.

In this disclosure, first and second orthogonal directions X and Y are referred to herein as "horizontal" or "lateral" directions, whereas the directions perpendicular to a plane defined by the X and Y directions, such as a third direction Z, are referred to herein as upward or downward directions and are also referred to herein as the "vertical" directions. The directions referred to herein are in the frame of reference of the structures referred to. Thus, these directions may lie at any orientation to the normal or gravitational frame of reference. A statement that one feature is disposed at a greater height "above a surface" than another feature means that the one feature is at a greater distance in the same orthogonal direction away from the surface than the other feature. Conversely, a statement that one feature is disposed at a lesser height "above a surface" than another feature means that the one feature is at a smaller distance in the same orthogonal direction away from the surface than the other feature.

Figure 1:
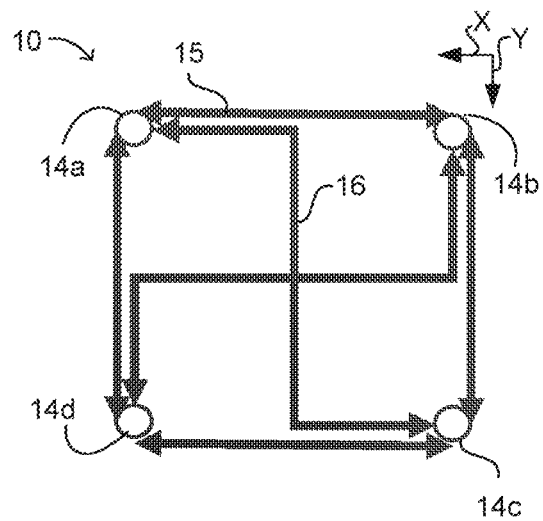
FIG. 1 is a diagrammatic plan view of the connections between adjacent nodes in a conventional multi-core processor die.

As illustrated in FIG. 1, a conventional multi-core processor wafer 10 may have a plurality of adjacent nodes 14a, 14b, 14c, and 14d (collectively nodes 14) arranged at the vertices of a square. Each of the nodes 14 may be electrically connected with adjacent ones of the nodes via an adjacent connection 15, and each of the nodes may be electrically connected with an opposite one of the nodes via an opposite connection 16. In a conventional node arrangement having an orthogonal or Manhattan routing, each of the adjacent connections 15 extends in one of the horizontal orthogonal directions X or Y, and each of the opposite connections 16 only has portions extending in the directions X and Y. In one example in which the adjacent nodes 14 are horizontally and vertically spaced apart from one another by 8 mm, each of the adjacent connections 15 will have a length of 8 mm, and each of the opposite connections 16 will have a length of 16 mm Limitations in lithography technology currently limit routing in CMOS wafers to electrical connections extending in orthogonal X and Y directions, as shown in FIG. 1.

Figure 2:
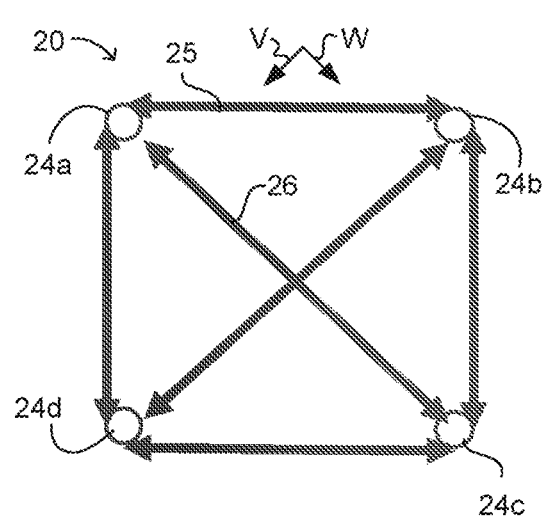
FIG. 2 is a diagrammatic plan view of the connections between adjacent nodes in a multi-core processor die according to one embodiment of the invention.

In contrast, as illustrated in FIG. 2, a multi-core processor wafer 20 according to one embodiment of the invention may have a plurality of adjacent nodes 24a, 24b, 24c, and 24d (collectively nodes 24) arranged at the vertices of a square. Each of the nodes 24 may be electrically connected with adjacent ones of the nodes via an adjacent connection 25, and each of the nodes may be electrically connected with an opposite one of the nodes via an oblique connection 26. In a node arrangement according to the invention, each of the adjacent connections 25 extends in one of the orthogonal horizontal directions X or Y, and each of the oblique connections 26 extends in oblique horizontal directions V or W. As shown, the oblique directions V and W are rotated 45 degrees from the orthogonal directions X and Y, although in other embodiments (e.g., FIG. 10), other oblique rotational orientations may be used. In one example in which the adjacent nodes 24 are horizontally and vertically spaced apart from one another by 8 mm, each of the adjacent connections 25 will have a length of 8 mm, and each of the oblique connections 26 will have a length of 11.3 mm, which is 29.3% less than the 16 mm length of the opposite connections 14 of FIG. 1.

Figure 3:
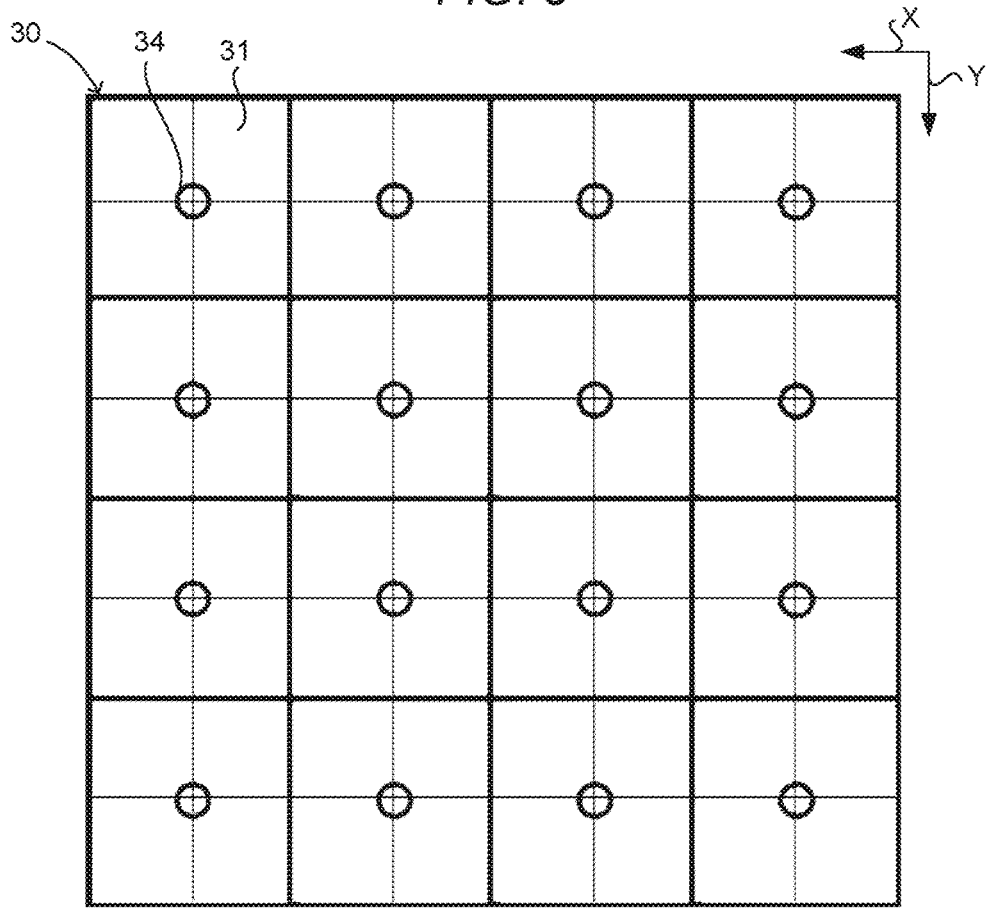
FIG. 3 is a diagrammatic plan view of a communication node design of a 64-core processor die.

As illustrated in FIG. 3, a conventional 64-core processor wafer arrangement is shown on a wafer 30 that has sixteen nodes 34, each node arranged at an intersection of four of the cores 31. The wafer 30 may be a semiconductor wafer that is implemented in one of various semiconductor materials such as silicon, silicon-germanium, indium phosphide, and gallium arsenide or one or more other Group III-V semiconductor compounds or Group II-VI semiconductor compounds, etc. The wafer 30 may have lengths in the orthogonal X and Y directions of 32 mm, for example. The wafer 30 may have layers of electrical connections configured to function in a hierarchical mesh network topology, including a core layer in which each node 34 is connected to each of the four cores 31 that are in contact with the node, and a network layer vertically adjacent to the core layer (in a Z direction orthogonal to the X and Y directions) a that contains connections between the nodes. For example, table 1 below shows the relationship between nodes 34 and cores 31 in a conventional hierarchical switch architecture, in which one node is required for every four cores, one hop is required for every $\log_4$ (nodes), and three switch ports are required for every hop.

TABLE 1

| CPU Cores (c) | Switch Nodes (n) | Hops (h) | Switch Ports (p) |
|---|---|---|---|
| 16 | 4 | 1 | 3 |
| 64 | 16 | 2 | 6 |
| 256 | 64 | 3 | 9 |
| 1024 | 256 | 4 | 12 |

Figure 4:
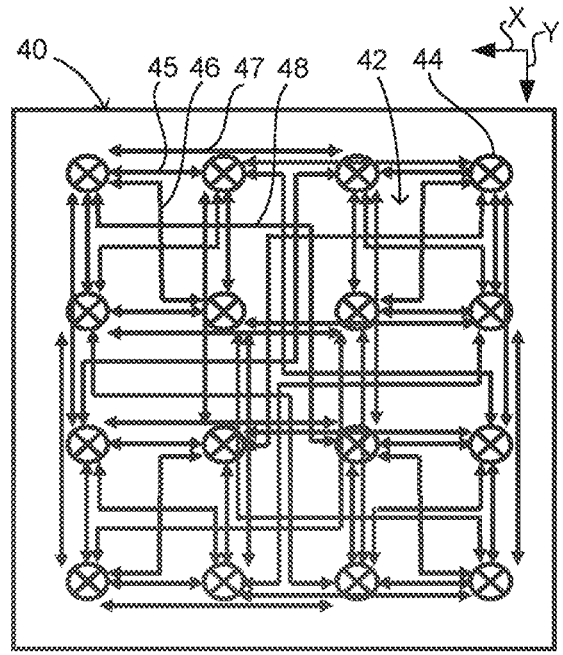
FIG. 4 is a diagrammatic plan view of connections between nearby nodes in conventional design architecture.

FIG. 4 illustrates a conventional 64-core processor wafer arrangement that is shown on a wafer 40 that has sixteen nodes 44, each node arranged at an intersection of four cores, in the manner shown in FIG. 3. The wafer 40 may have layers of electrical connections, including a network layer 42 that can be used to connect the nodes 44 to one another. Similar to the architecture shown in FIG. 1, the network layer 42 may have local adjacent connections 45 between adjacent ones of the nodes 44 and local opposite connections 46 between opposite ones of the nodes. However, the network layer 42 may also have longer unidirectional connections 47 that extend between two non-adjacent nodes 44 in one of the orthogonal horizontal directions X or Y and longer bidirectional connections 48 that extend between two non-adjacent modes only having portions extending in the directions X and Y. In one example in which the adjacent nodes 44 are horizontally and vertically spaced apart from one another by 8 mm, each of the local adjacent connections 45 will have a length of 8 mm, each of the local opposite connections 46 will have a length of 16 mm, each of the longer unidirectional connections 47 will have a length of 16 mm, and each of the longer bidirectional connections 48 will have a length of 32 mm.

Figure 5:
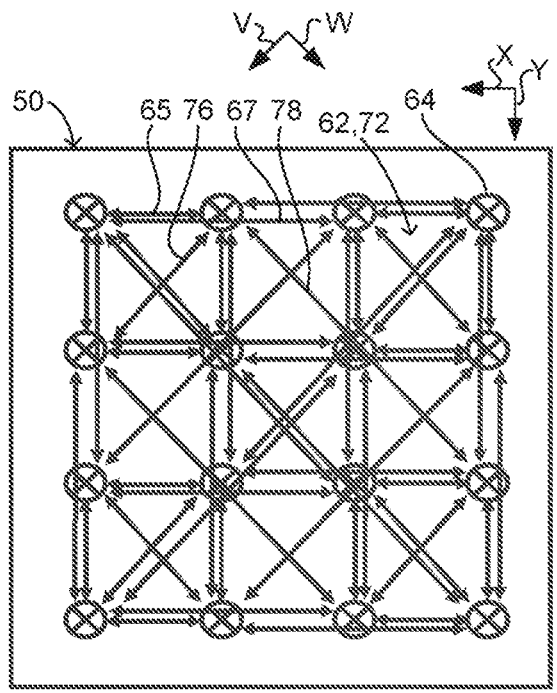
FIG. 5 is a diagrammatic plan view of connections between nearby nodes in a design architecture according to an embodiment of the invention.
Figure 5A:
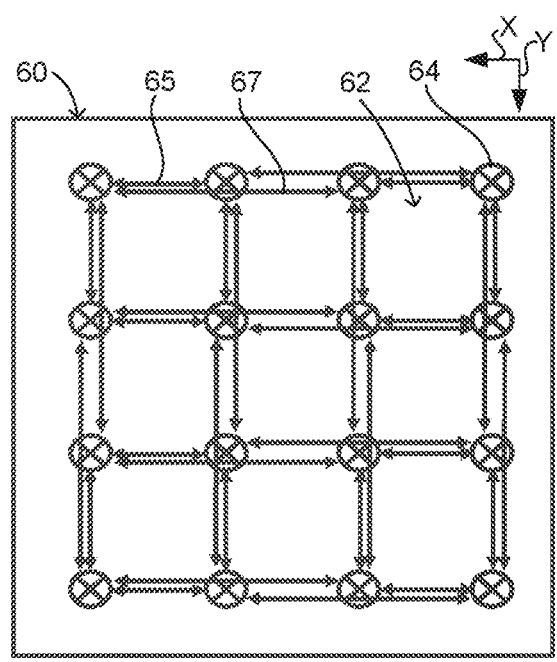
FIG. 5A is a diagrammatic plan view of horizontal connections between nearby nodes in the design architecture of FIG. 5.
Figure 5B:
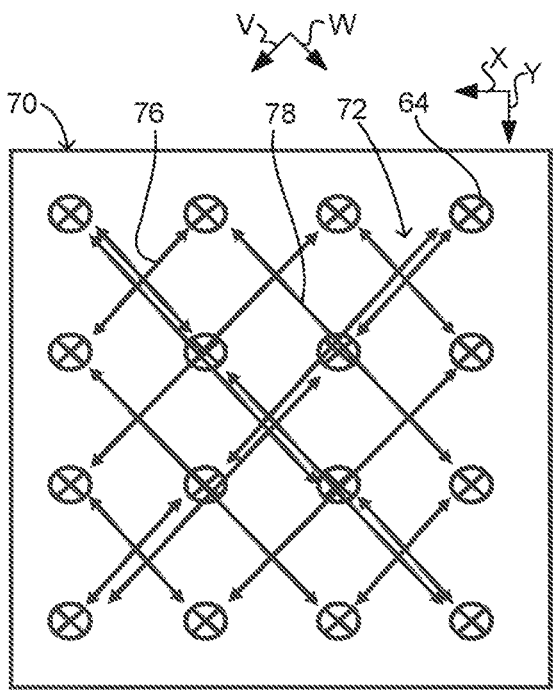
FIG. 5B is a diagrammatic plan view of diagonal connections between nearby nodes in the design architecture of FIG. 5.

FIGS. 5, 5A, and 5B illustrate a microelectronic assembly 50 including a wafer 60 and an interconnection structure 70. The wafer 60 includes a 64-core processor wafer arrangement according to an embodiment of the invention. The wafer 60 has sixteen nodes 64, each node arranged at an intersection of four cores, in the manner shown in FIG. 3. The wafer 60 may have unitary crystalline structure of semiconductor material, or it may be a reconstituted wafer.

The wafer 60 may have an orthogonal network layer 62 of electrical connections (shown separately in FIG. 5A) that can connect the nodes 64 to one another along directions of a first orthogonal set of directions X, Y. The interconnection structure 70 may have an oblique network layer 72 (shown separately in FIG. 5B) that can connect the nodes 64 to one another along directions of a second set of directions V, W that are each oriented at an oblique angle to the first orthogonal set of directions.

Referring to FIGS. 5 and 5A, the orthogonal network layer 62 may have local adjacent connections 65 between adjacent ones of the nodes 64 and longer unidirectional connections 67 that extend between two non-adjacent nodes in one of the orthogonal horizontal directions X or Y. The orthogonal network layer 62 may be contained within the wafer 60. In one example in which the adjacent nodes are horizontally and vertically spaced apart from one another by 8 mm, each of the local adjacent connections 65 will have a length of 8 mm, and each of the longer unidirectional connections 67 will have a length of 16 mm.

Referring to FIGS. 5 and 5B, similar to the architecture shown in FIG. 2, the oblique network layer 72 may have local oblique connections 76 between opposite ones of the nodes. Each of the local oblique connections 76 extends in oblique horizontal directions V or W that are rotated 45 degrees from the orthogonal directions X and Y, although in other embodiments (e.g., FIG. 10), other oblique rotational orientations may be used. The oblique network layer 72 may also have longer oblique connections 78 that extend between two non-adjacent nodes 64 in the oblique horizontal directions V or W.

In an example in which the adjacent nodes 64 are horizontally and vertically spaced apart from one another by 8 mm, each of the local oblique connections 76 will have a length of 11.3 mm, and each of the longer oblique connections 78 will have a length of 22.6 mm Therefore, the local oblique connections 76 of 11.3 mm are each 29.3% less than the 16 mm length of the local opposite connections 46 of FIG. 4, and the longer oblique connections 78 of 22.6 mm are each 29.3% less than the 32 mm length of the longer bidirectional connections 48 of FIG. 4.

The oblique network layer 72 may extend within the interconnection structure 70 that is affixed to an active surface of the wafer 60. The interconnection structure 70 may comprise a low-loss directly-bonded interconnect layer or layers that permit the oblique routing of the local oblique connections 76 and the longer oblique connections 78. Suitable low-loss materials for the oblique network layer 72 may include glass, quartz, sapphire, or ZIF. The use of low-loss materials for the interconnection structure 70 that includes the oblique network layer 72 permits longer-distance connections to experience shorter latency than the same connections in semiconductor material.

The interconnection structure 70 may be bonded in a stacked arrangement with the wafer 60 using various bonding techniques, including using direct dielectric bonding, non-adhesive techniques, such as a ZiBond® direct bonding technique, or a DBI® hybrid bonding technique, both available from Invensas Bonding Technologies, Inc. (formerly Ziptronix, Inc.), a subsidiary of Xperi Corp. (see for example, U.S. Pat. Nos. 6,864,585 and 7,485,968, which are incorporated herein in their entirety). According to some examples, thermocompression bonding may be used. This process may enable the interconnection structure 70 to bond to the wafer 60 with adjacent electrical connections at an extremely fine pitch. For example, the connection may be at a pitch as low as approximately 1μ-10μ. In such a direct bonding example, a surface of the interconnection structure 70 may be laminated onto a confronting exposed front surface of the wafer 60, and heat and pressure may be used to bond the confronting surfaces to one another.

Figure 6:
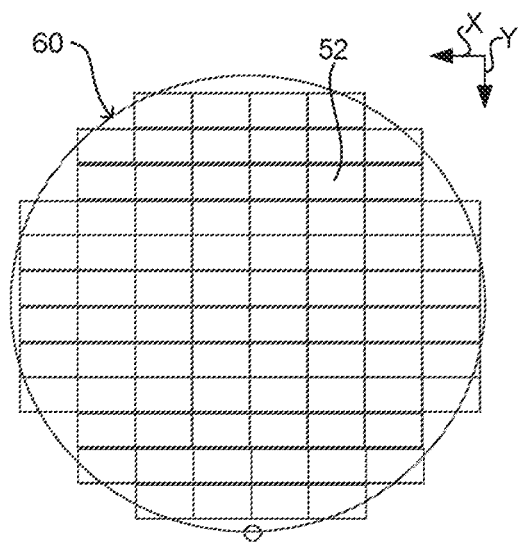
FIG. 6 is a diagrammatic plan view of a plurality of reticles overlying a semiconductor wafer, the reticles configured to create an interconnection pattern configured in a Manhattan routing.

Referring to FIG. 6, the orthogonal network layer 62 may be formed in the wafer 60 using reticles 52 as an aligner mask. An arrangement of the reticles 52 may be placed overlying the wafer 60 in a pattern extending in the first orthogonal set of directions X, Y. As shown in FIG. 6, each reticle 52 is rectangular in shape, but in other examples, each reticle may have a square shape. Lithography is then performed on the wafer 60 to form the local adjacent connections 65 and the longer unidirectional connections 67 of the orthogonal network layer 62, the connections extending in the first orthogonal set of directions X, Y relative to the lithography equipment.

Figure 7:
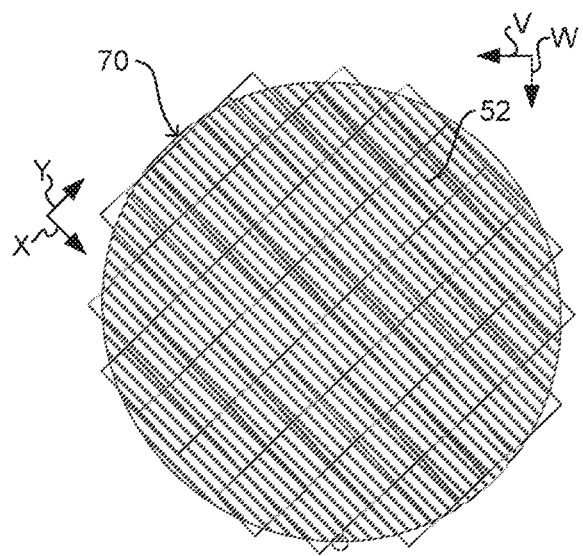
FIG. 7 is a diagrammatic plan view of a plurality of reticles overlying a low-loss interposer, the reticles configured to create an interconnection pattern at an oblique angle to a Manhattan routing.

Referring now to FIG. 7, the oblique network layer 72 may be formed in the interconnection structure 70 using the reticles 52 as an aligner mask. An arrangement of the reticles 52 may be placed overlying the interconnection structure 70 in a pattern extending in the first orthogonal set of directions X, Y. As shown in FIG. 7, each reticle 52 is rectangular in shape, but in other examples, each reticle may have a square shape. Before the lithography is performed, the interconnection structure 70 with the reticles 52 thereon may be rotated relative to the lithography equipment, by an oblique angle such as 45 degrees. Then, lithography may performed to form connections extending in the second set of directions V, W that are obliquely oriented relative to the X, Y orientation of the reticles.

Figure 8:
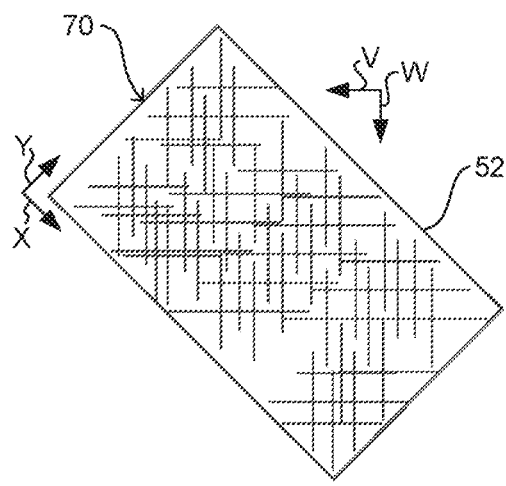
FIG. 8 is a diagrammatic plan view of a portion of the low-loss interposer of FIG. 7 after the oblique interconnection pattern is created.

The resulting connection patterns in the interconnection structure 70 relative to one of the reticles 52 are shown in FIG. 8, in which the local oblique connections 76 and the longer oblique connections 78 of the oblique network layer 72 extend in the second set of horizontal directions V, W, while the example reticle 52 extends in the first set of horizontal directions X, Y.

Figure 9:
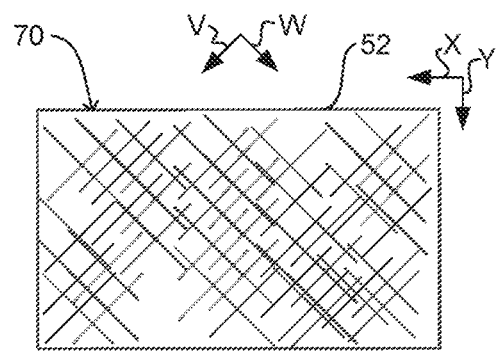
FIG. 9 is a diagrammatic plan view of a portion of the low-loss interposer of FIG. 7 rotated to a position that aligns with the corresponding semiconductor wafer of FIG. 6.

Accordingly, referring to FIG. 9, after the local oblique connections 76 and the longer oblique connections 78 are formed in the interconnection structure 70, the interconnection structure may be rotated relative to the wafer 60, so that the areas that were previously covered by the reticles 52 are in alignment between the wafer and the interconnection structure. The combined pattern of connections will be as shown in FIG. 5, in which the local adjacent connections 65 and the longer unidirectional connections 67 of the orthogonal network layer 62 extend in the first orthogonal set of directions X, Y, and in which the local oblique connections 76 and the longer oblique connections 78 of the oblique network layer 72 extend in the second oblique set of directions V, W.

Figure 10:
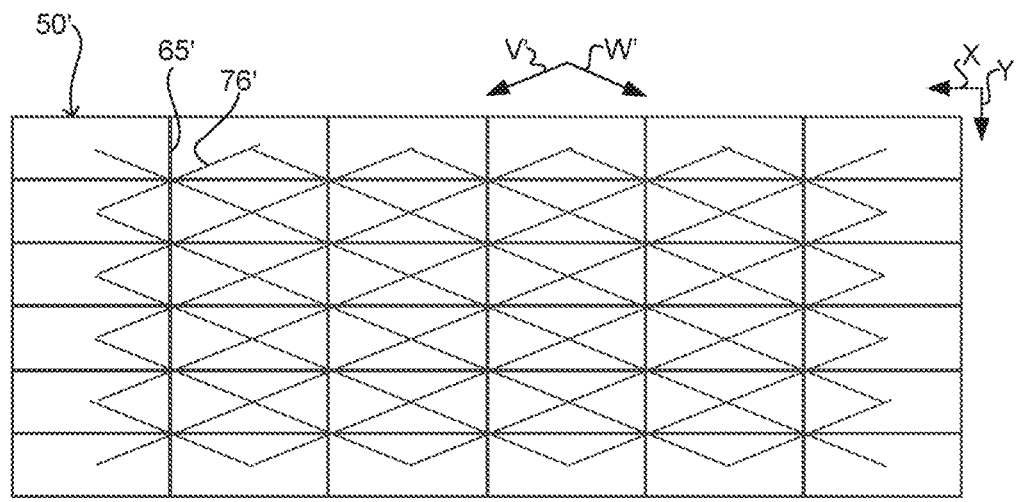
FIG. 10 is a diagrammatic plan view of a portion of a low-loss interposer having a non-45 degree oblique interconnection pattern.

FIG. 10 illustrates connections in a microelectronic assembly 50' that is a variation of the microelectronic assembly 50, but having a non-45 degree oblique interconnection pattern between the local adjacent connections 65' and the local oblique connections 76'. For example, rather than having the second oblique set of directions V, W be orthogonal relative to one another, the directions V' and W' can each be obliquely oriented at the same angle relative to the horizontal direction X, which need not be 45 degrees. As shown in FIG. 10, each of the directions V' and W' may be angled at 30 degrees relative to the horizontal direction X, such that the directions V' and W' are offset from each other by 120 degrees. The example shown in FIG. 10 is only one possibility. The directions V' and W' may be angled at other oblique angles relative to the horizontal direction X, such as 15°, 20°, 30°, 50°, 60°, 75°, or other angles not listed here.

Figure 11:
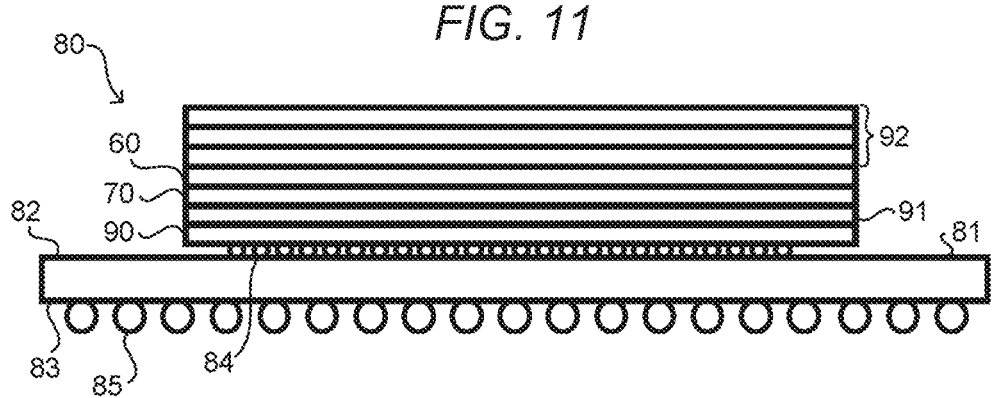
FIG. 11 is a side sectional view of an example package including a semiconductor having a Manhattan routing and a low-loss interposer having an interconnection at an oblique angle to the Manhattan routing.

FIG. 11 illustrates one example of a microelectronic package 80 including the wafer 60 and the interconnection structure 70 mounted to a substrate 81. The microelectronic package 80 may have a core layer 90 that is configured to function in a hierarchical mesh network topology with the wafer 60 (that serves as the network layer). An interposer 91 may be disposed adjacent to the core layer 90, and the interconnection structure 70 may be disposed between the interposer 91 and the wafer 60.

The core layer 90, the interposer 91, and the wafer 60 may each have electrical connections extending in the first set of orthogonal horizontal directions X and Y, and the interconnection structure 70 may have electrical interconnections extending in the second set of oblique horizontal directions V and W, similar to the connections described above with regard to the microelectronic assembly 50. Expansion wafers 92 similar to the base wafer 60 may be stacked above the base wafer 60. In the embodiment shown, the core layer 90, the base wafer 60, and the expansion wafers 92 may together function as a hierarchical mesh network.

The core layer 90 may be flip-chip mounted to a first surface 82 of the substrate 81 via conductive bumps 84, which may be spaced from one another at a 150μ pitch, for example. A second surface 83 of the substrate 81 may have conductive terminals 85 exposed thereat that are configured for electrical connection with a component external to the microelectronic package 80. Each of the core layer 90, the interposer 91, the interconnection structure 70, the base wafer 60, and the expansion wafers 92 may be directly bonded to one another in a vertical stack overlying the substrate 80, using any of the various bonding techniques described above with reference to the microelectronic assembly 50. Through-silicon vias, or TSVs (not shown), may be used for inter-wafer electrical interconnection among the aforementioned layers, wafers, and structures.

Figure 12:
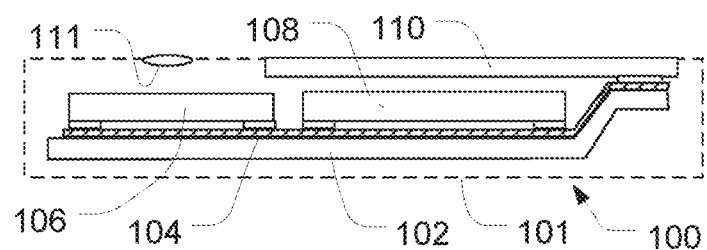
FIG. 12 illustrates an example system according to aspects of the disclosure.

The microelectronic assemblies and microelectronic packages described above with reference to FIGS. 1-11 above can be utilized in construction of diverse electronic systems, such as the system 100 shown in FIG. 12. For example, the system 100 in accordance with a further embodiment of the invention includes a plurality of modules or components 106 such as the microelectronic assemblies 50 and 50' and microelectronic package 80 described above, in conjunction with other electronic components 108, 110 and 111.

In the exemplary system 100 shown, the system can include a circuit panel, motherboard, or riser panel 102 such as a flexible printed circuit board, and the circuit panel can include numerous conductors 104, of which only one is depicted in FIG. 12, interconnecting the modules or components 106, 108, 110 with one another. Such a circuit panel 102 can transport signals to and from each of the microelectronic packages and/or microelectronic assemblies included in the system 100. However, this is merely exemplary; any suitable structure for making electrical connections between the modules or components 106 can be used.

In a particular embodiment, the system 100 can also include a processor such as the semiconductor chip 108, such that each module or component 106 can be configured to transfer a number N of data bits in parallel in a clock cycle, and the processor can be configured to transfer a number M of data bits in parallel in a clock cycle, M being greater than or equal to N.

In the example depicted in FIG. 12, the component 108 is a semiconductor chip and component 110 is a display screen, but any other components can be used in the system 100. Of course, although only two additional components 108 and 111 are depicted in FIG. 12 for clarity of illustration, the system 100 can include any number of such components.

Modules or components 106 and components 108 and 111 can be mounted in a common housing 101, schematically depicted in broken lines, and can be electrically interconnected with one another as necessary to form the desired circuit. The housing 101 is depicted as a portable housing of the type usable, for example, in a cellular telephone or personal digital assistant, and screen 110 can be exposed at the surface of the housing. In embodiments where a structure 106 includes a light-sensitive element such as an imaging chip, a lens 111 or other optical device also can be provided for routing light to the structure. Again, the simplified system shown in FIG. 12 is merely exemplary; other systems, including systems commonly regarded as fixed structures, such as desktop computers, routers and the like can be made using the structures discussed above.

It will be appreciated that the various dependent claims and the features set forth therein can be combined in different ways than presented in the initial claims. It will also be appreciated that the features described in connection with individual embodiments may be shared with others of the described embodiments. For example, the microelectronic package 80 shown in FIG. 11 may be modified to omit the expansion layers 92. Also, although the wafers herein are described as semiconductor wafer, in other embodiments, the wafers herein such as the wafer 60 may be a semiconductor die that is directly bonded to a semiconductor wafer and/or an interconnection structure such as the interconnection structure 70.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of forming a microelectronic assembly for a mesh network of a plurality of processor cores, the microelectronic assembly, comprising:
   providing a plurality of orthogonal connections in a first element, the orthogonal connections each extending in one of first and second horizontal directions, the first and second horizontal directions oriented orthogonal to one another;
   providing a plurality of oblique connections in a second element; the oblique connections each extending in one of third and fourth horizontal directions, the third and fourth horizontal directions each oriented at an oblique angle relative to the first and second directions; and
   directly hybrid bonding the first element to the second element such that the orthogonal connections and the oblique connections interconnect a plurality of network nodes, the network nodes connected to the plurality of processor cores in the mesh network, wherein the mesh network permits an electrical signal to travel from any one of the network nodes to any other one of the network nodes through the orthogonal connections and/or oblique connections.

2. The method of claim 1, wherein the second element comprises an interconnect dielectric material selected from the group consisting of glass, quartz, sapphire, benzocyclobutene (BCB) or ZIF.

3. The method of claim 1, wherein the orthogonal connections include local orthogonal connections between orthogonally separated adjacent ones of the network nodes, and longer orthogonal connections between orthogonally separated non-adjacent ones of the network nodes.

4. The method of claim 1, wherein the oblique connections include local oblique connections between obliquely separated adjacent ones of the network nodes, and longer oblique connections between obliquely separated non-adjacent ones of the network nodes.

5. The method of claim 1, wherein the plurality of processor cores are formed in a core semiconductor layer, further comprising joining and electrically interconnecting the core semiconductor layer to the first element and the second element.

6. The method of claim 4, wherein joining and electrically interconnecting the core semiconductor layer to the first element and the second element comprises directly bonding.

7. The method of claim 4, further comprising joining and electrically interconnecting an interposer between the core semiconductor layer and the first and second elements.

8. The method of claim 6, wherein joining and electrically interconnecting the interposer comprises directly bonding.

9. The method of claim 6, further comprising flip-chip mounting the core semiconductor layer to a packaging substrate.

10. The method of claim 6, further comprising joining and electrically interconnecting expansion layers to the core semiconductor layer, the interposer, the first element and the second element.

* * * * *